(12) United States Patent
Xiong et al.

(10) Patent No.: US 11,373,436 B2
(45) Date of Patent: Jun. 28, 2022

(54) FINGERPRINT IDENTIFICATION APPARATUS AND ELECTRONIC DEVICE

(71) Applicant: SHENZHEN GOODIX TECHNOLOGY CO., LTD., Shenzhen (CN)

(72) Inventors: Feng Xiong, Shenzhen (CN); Yiping Guo, Shenzhen (CN)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 10 days.

(21) Appl. No.: 17/139,950

(22) Filed: Dec. 31, 2020

(65) Prior Publication Data
US 2021/0124895 A1 Apr. 29, 2021

Related U.S. Application Data

(63) Continuation of application No. PCT/CN2019/079596, filed on Mar. 25, 2019.

(51) Int. Cl.
*G06V 40/13* (2022.01)
*H05K 1/02* (2006.01)

(52) U.S. Cl.
CPC ....... *G06V 40/1318* (2022.01); *H05K 1/0281* (2013.01); *H05K 2201/10128* (2013.01)

(58) Field of Classification Search
CPC .......... G06V 40/1318; G06V 40/1306; G06V 40/13; G06V 40/1365; G06V 40/1324; G06V 40/1329; G06V 10/147; G06V 40/1359; G06V 40/1341; G06V 10/141; G06V 40/1312; G06V 40/12; G06V 40/1335; G06V 40/1347; G06V 40/1394;
(Continued)

(56) References Cited

U.S. PATENT DOCUMENTS

| | | | | |
|---|---|---|---|---|
| 6,054,509 A | * | 4/2000 | Arai | H05K 3/386 523/428 |
| 2018/0165499 A1 | * | 6/2018 | Hsu | G06V 40/1329 |

(Continued)

FOREIGN PATENT DOCUMENTS

| | | |
|---|---|---|
| CN | 206209652 U | 5/2017 |
| CN | 107480579 A | 12/2017 |

(Continued)

*Primary Examiner* — Ajibola A Akinyemi

(57) ABSTRACT

A fingerprint identification apparatus and an electronic device, capable of reducing under-screen space occupied by the fingerprint identification apparatus and facilitating assembly of the fingerprint identification apparatus. The fingerprint identification apparatus is applicable to an electronic device having a display screen, and includes: at least one optical fingerprint sensor; and a flexible circuit board electrically connected to the at least one optical fingerprint sensor; where a first adhesive layer is disposed at a periphery of the flexible circuit board for connecting the flexible circuit board and the display screen, so that the at least one optical fingerprint sensor is located under the display screen, the at least one optical fingerprint sensor is configured to receive a fingerprint detecting signal returned by reflection or scattering via a human finger on the display screen, and the fingerprint detecting signal is used to detect fingerprint information of the finger.

20 Claims, 6 Drawing Sheets

(58) Field of Classification Search
CPC ............... G06V 10/17; G06V 40/1376; G06V 40/1353; G06V 40/1382; G06V 40/45
USPC ........................................................ 382/124
See application file for complete search history.

(56) References Cited

U.S. PATENT DOCUMENTS

| | | | |
|---|---|---|---|
| 2018/0293420 A1 | 10/2018 | Kim et al. | |
| 2019/0005295 A1* | 1/2019 | Jia | ........................ H01L 27/307 |
| 2019/0012512 A1 | 1/2019 | He | |

FOREIGN PATENT DOCUMENTS

| | | | |
|---|---|---|---|
| CN | 107577278 | A | 1/2018 |
| CN | 108091771 | A | 5/2018 |
| CN | 108323207 | A | 7/2018 |
| CN | 109062333 | A | 12/2018 |
| CN | 208271201 | U | 12/2018 |
| CN | 208298205 | U | 12/2018 |
| CN | 109117728 | A | 1/2019 |
| CN | 109416558 | A | 3/2019 |
| CN | 109416737 | A | 3/2019 |
| CN | 109460731 | A | 3/2019 |
| CN | 109508599 | A | 3/2019 |

* cited by examiner

FINGERPRINT IDENTIFICATION APPARATUS AND ELECTRONIC DEVICE

CROSS-REFERENCE TO RELATED APPLICATIONS

This application is a continuation of International Application No. PCT/CN2019/079596, filed on Mar. 25, 2019, the disclosure of which is hereby incorporated by reference in its entirety.

TECHNICAL FIELD

The present application relates to the field of optical fingerprint technologies, and more particularly, to a fingerprint identification apparatus and an electronic device.

BACKGROUND

In a current assembly solution of an under-screen optical fingerprint identification apparatus, one is to dispose a fingerprint sensor chip in a fingerprint identification module in a support structure under a display screen, and ensure that there is a certain distance between the fingerprint sensor chip and the display screen, resulting in a great thickness of space under the screen occupied by the fingerprint identification module; and another is to attach a fingerprint sensor chip fully to a bottom of a display screen, that is, to tightly bond an upper surface of the fingerprint sensor chip and the bottom of the screen together, resulting in poor flexibility of assembly between a fingerprint identification module and the display screen, and difficult disassembly and maintenance.

Therefore, how to reduce under-screen space occupied by a fingerprint identification module and facilitate assembly of the fingerprint identification module is an urgent problem to be solved.

SUMMARY

Embodiments of the present application provide a fingerprint identification apparatus and an electronic device, which are capable of reducing under-screen space occupied by the fingerprint identification apparatus and facilitating assembly of the fingerprint identification apparatus.

In a first aspect, a fingerprint identification apparatus is provided, and is applicable to an electronic device having a display screen, including:
at least one optical fingerprint sensor; and
a flexible circuit board electrically connected to the at least one optical fingerprint sensor;
where a first adhesive layer is disposed at a periphery of the flexible circuit board for connecting the flexible circuit board and the display screen, so that the at least one optical fingerprint sensor is located under the display screen, the at least one optical fingerprint sensor is configured to receive a fingerprint detecting signal returned by reflection or scattering via a human finger on the display screen, and the fingerprint detecting signal is used to detect fingerprint information of the finger.

In an embodiment of the present application, a flexible circuit board is connected to a display screen through a first adhesive layer, so that the flexible circuit board and at least one optical fingerprint sensor electrically connected to the flexible circuit board are disposed under the display screen, which reduces under-screen space occupied by a fingerprint identification apparatus. The first adhesive layer is disposed at a periphery of the flexible circuit board and has a small area in contact with the display screen, which facilitates assembly, disassembly and maintenance of the fingerprint identification apparatus.

In a possible implementation manner, an optical fingerprint senor of the at least one optical fingerprint sensor includes: a micro lens array, at least one light shielding layer and a light detection array;
the at least one light shielding layer is disposed under the micro lens array, where each of the at least one light shielding layer is provided with a plurality of light passing holes; and the light detection array is disposed under the at least one light shielding layer;
where the micro lens array is configured to converge the fingerprint detecting signal to a plurality of light passing holes of the at least one light shielding layer, and the fingerprint detecting signal is transmitted to the light detection array through the plurality of light passing holes.

In a possible implementation manner, the first adhesive layer is configured to connect a display assembly of the display screen and the flexible circuit board.

In a possible implementation manner, the first adhesive layer is configured to connect a light-blocking protective layer of the display screen and the flexible circuit board.

In a possible implementation manner, the first adhesive layer is configured to connect a display screen flexible circuit board of the display screen and the flexible circuit board of the fingerprint identification apparatus.

In a possible implementation manner, a distance between an upper surface of the at least one optical fingerprint sensor and a lower surface of a light-emitting layer of the display screen is less than or equal to 600 μm.

In a possible implementation manner, the flexible circuit board includes a stiffening layer and a circuit layer, and the stiffening layer is disposed under the circuit layer;
where the circuit layer is provided with a window, and the at least one optical fingerprint sensor is disposed on the stiffening layer and located in the window.

In a possible implementation manner, the at least one optical fingerprint sensor is connected to the stiffening layer through a second adhesive layer.

In a possible implementation manner, the first adhesive layer is in a hollow square or circular shape, and is disposed in a non-circuit region of the flexible circuit board.

In a possible implementation manner, a first sealant is disposed on an outer side of the first adhesive layer for connecting the display screen, the first adhesive layer and the flexible circuit board.

In a possible implementation manner, the fingerprint identification apparatus further includes:
a filter disposed between the at least one optical fingerprint sensor and the display screen for filtering out a light signal in a non-target wave band and transmitting a light signal in a target wave band.

In a possible implementation manner, reflectance of the filter to light is less than 1%.

In a possible implementation manner, there is an air gap or an adhesive with a low refractive index between the filter and the at least one optical fingerprint sensor, and the adhesive with the low refractive index has a refractive index less than 1.3.

In a possible implementation manner, the at least one optical fingerprint sensor is electrically connected to the circuit layer through an electrical connection device; and
the electrical connection device is lower than a lower surface of the filter.

In a possible implementation manner, an upper surface of the first adhesive layer is not higher than an upper surface of the filter.

In a possible implementation manner, a third adhesive layer is disposed at the periphery of the flexible circuit board for connecting the flexible circuit board and the filter.

In a possible implementation manner, the third adhesive layer is in a hollow square or circular shape, and is disposed in a non-circuit region of the flexible circuit board.

In a possible implementation manner, a distance between the third adhesive layer and the first adhesive layer is greater than 0.6 mm.

In a possible implementation manner, an adhesive width of the third adhesive layer is greater than 0.6 mm.

In a possible implementation manner, a second sealant is disposed on an outer side of the third adhesive layer for connecting the filter, the third adhesive layer and the flexible circuit board.

In a possible implementation manner, the stiffening layer is a metal stiffening plate, and/or a thickness of the stiffening layer ranges from 0.15 mm to 0.30 mm, and/or a contour arithmetic mean deviation Ra of surface roughness of the stiffening layer is greater than 0.25 µm, and/or planeness of the stiffening layer is less than 0.03 mm.

In a second aspect, an electronic device is provided, including: a display screen and the fingerprint identification apparatus in the first aspect or any one of possible implementation manners of the first aspect, where the fingerprint identification apparatus is disposed under the display screen to implement under-screen fingerprint detection.

DESCRIPTION OF EMBODIMENTS

Figure 1:
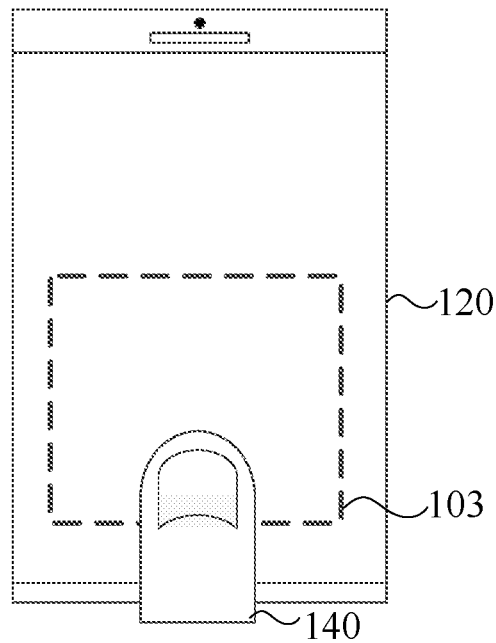
FIG. 1 is a schematic structural diagram of a terminal device applicable to an embodiment of the present application.
Figure 1:
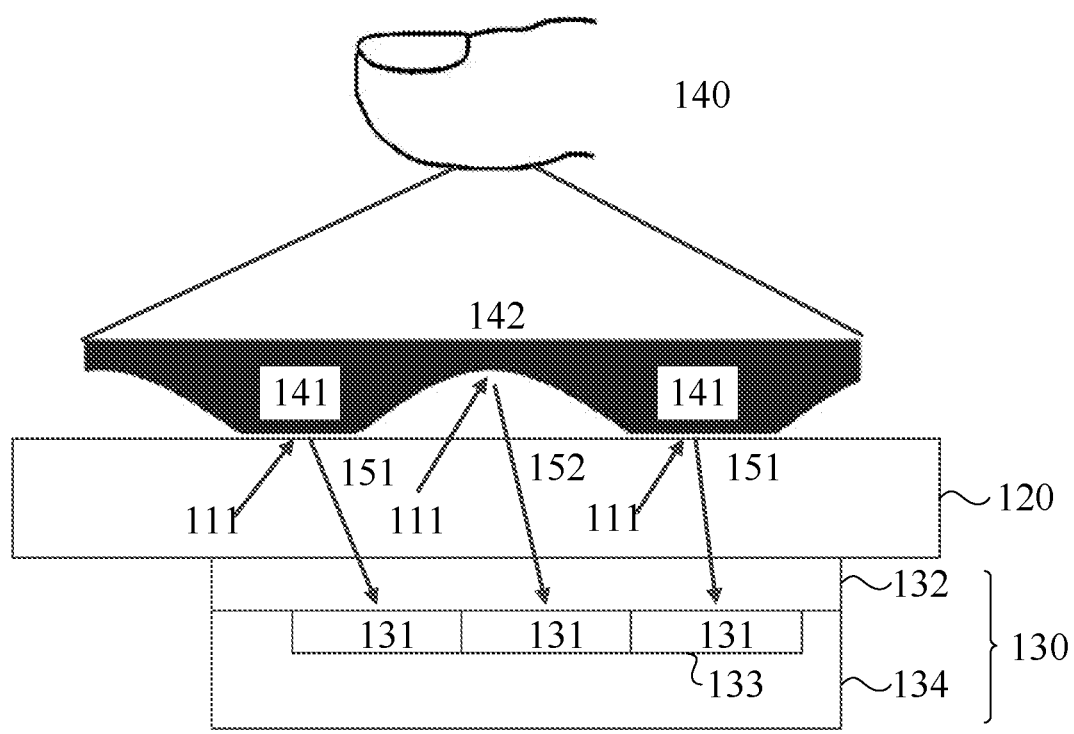

As a smart terminal enters an era of full screen, a fingerprint capturing region on a front face of an electronic device is squeezed by the full screen, and therefore, under-display or under-screen fingerprint identification technology has gained an increasing attention. The under-screen fingerprint identification technology refers to mounting a fingerprint identification apparatus (for example, a fingerprint identification module) under a display screen, so as to realize a fingerprint identification operation in a display region of the display screen without setting a fingerprint capturing region in a region other than the display region on a front face of an electronic device.

The under-screen fingerprint identification technology may include under-screen optical fingerprint identification technology, under-screen ultrasonic fingerprint identification technology, or other types of under-screen fingerprint identification technology.

In an example of the under-screen optical fingerprint identification technology, the under-screen optical fingerprint identification technology uses light returned from a top surface of a display assembly of a device for fingerprint sensing and other sensing operations. The returned light carries information of an object (e.g., a finger) in contact with the top surface, and a specific optical sensor module located under a display screen is implemented by capturing and detecting the returned light. The specific optical sensor module may be designed to achieve desired optical imaging by properly configuring an optical element for capturing and detecting returned light.

It should be understood that technical solutions of embodiments of the present application may be applied to various electronic devices, and more particularly, to an electronic device having a display screen, for example, a portable or mobile computing device such as a smartphone, a laptop, a tablet and a gaming device, and another electronic device such as an electronic database, an automobile and a bank automated teller machine (ATM), which is not limited in the embodiments of the present application.

It should also be understood that the technical solutions of the embodiments of the present application can perform other biometric identification in addition to fingerprint identification, for example, living body identification, which is not limited in the embodiments of the present application.

The technical solutions in the embodiments of the present application will be described hereinafter with reference to the accompanying drawings.

It should be noted that, for convenience of description, in the embodiments of the present application, the same reference signs represent the same components, and detailed description of the same components is omitted in different embodiments for brevity.

It should understood that, dimensions such as the thicknesses, lengths and widths of various components in the embodiments of the present application shown in the drawings, as well as dimensions of the overall thickness, length and width of a fingerprint identification apparatus are merely illustrative, and should not constitute any limitation to the present application.

FIG. 1 shows a schematic structural diagram of a terminal device applicable to an embodiment of the present application. A terminal device 10 includes a display screen 120 and a fingerprint identification module 130, where the fingerprint identification module 130 is disposed in a partial region under the display screen 120. The fingerprint identification module 130 includes an optical fingerprint sensor including a sensing array 133 having a plurality of optical sensing units 131, and a region where the sensing array 133 is located or its sensing region is a fingerprint detecting region 103 of the fingerprint identification module 130. As shown in FIG. 1, the fingerprint detecting region 103 is located in a display region of the display screen 120. In an alternative embodiment, the fingerprint identification module 130 may also be disposed at another position, such as a side of the display screen 120 or an non-light-transmitting region of an edge of the terminal device 10, and a light signal from at least part of the display region of the display screen 120 is directed to the fingerprint identification module 130 through a light path design, so that the fingerprint detecting region 103 is actually located in the display region of the display screen 120.

It should be understood that an area of the fingerprint detecting region 103 may be different from an area of the sensing array of the fingerprint identification module 130. For example, the area of the fingerprint detecting region 103 of the fingerprint identification module 130 may be larger than the area of the sensing array of the fingerprint identification module 130 through for example, a lens imaging light path design, a reflective folding light path design or other light path designs such as light convergence or reflection. In other alternative implementation manners, if a light path is directed in a manner of light collimation for example, the area of the fingerprint detecting region 103 of the fingerprint identification module 130 may also be designed to be substantially identical with the area of the sensing array of the fingerprint identification module 130.

Therefore, when a user needs to unlock the terminal device or perform other fingerprint verification, a fingerprint input can be implemented merely by pressing a finger against the fingerprint detecting region 103 in the display screen 120. Since fingerprint detection may be implemented in the screen, there is no need to exclusively reserve space for a front face of the terminal device 10 in the foregoing structure to set a fingerprint button (such as a Home button), so that a full screen solution may be adopted; that is, the display region of the display screen 120 may be substantially extended to the entire front face of the terminal device 10.

As an optional implementation manner, as shown in FIG. 1, the fingerprint identification module 130 includes a light detecting portion 134 and an optical assembly 132. The light detecting portion 134 includes the sensing array, a readout circuit and other auxiliary circuits electrically connected to the sensing array, and may be fabricated on a die such as on an optical imaging chip or an optical fingerprint sensor by a semiconductor process. The sensing array is specifically a photo detector array including a plurality of photo detectors distributed in an array, and the photo detectors may serve as the optical sensing units as described above. The optical assembly 132 may be disposed above the sensing array of the light detecting portion 134, and may specifically include a filter, a light directing layer or a light path directing structure, and other optical elements, the filter may be configured to filter out ambient light passing through a finger, and the light directing layer or light path directing structure is mainly configured to direct reflected light reflected from a finger surface to the sensing array for optical detection.

In a specific implementation, the optical assembly 132 and the light detecting portion 134 may be encapsulated in the same optical fingerprint component. For example, the optical assembly 132 and the optical detecting portion 134 may be encapsulated in the same optical fingerprint chip, or the optical assembly 132 may be disposed outside a chip where the optical detecting portion 134 is located, for example, the optical assembly 132 is attached above the chip, or some elements of the optical assembly 132 are integrated into the foregoing chip.

The light directing layer or the light path directing structure of the optical assembly 132 has various implementations. For example, the light directing layer may be specifically a collimator layer fabricated on a semiconductor silicon wafer, which has a plurality of collimating units or a micro hole array, and the collimating units may be specifically small holes. Among reflected light reflected back from a finger, light that is vertically incident to the collimating unit may pass through the collimating unit and be received by an optical sensing unit under the collimating unit, and light with an overlarge incident angle is attenuated through multiple reflections inside the collimating unit. Therefore, each optical sensing unit may basically only receive reflected light reflected back from a fingerprint pattern right above the optical sensing unit, and thus the sensing array may detect a fingerprint image of the finger.

In another embodiment, the light directing layer or the light path directing structure may also be an optical lens layer having one or more lens units, for example, a lens group composed of one or more aspheric lenses, for converging reflected light reflected back from a finger to the sensing array of the light detecting portion 134 under the optical lens layer, so that the sensing array may perform imaging based on the reflected light so as to obtain a fingerprint image of the finger. Optionally, the optical lens layer may further be provided with a pinhole formed in a light path of the lens unit, and the pinhole may cooperate with the optical lens layer to expand the field of view of the fingerprint identification module to improve a fingerprint imaging effect of the fingerprint identification module 130.

As an optional embodiment, the display screen 120 may adopt a display screen with a self-light-emitting display unit, for example, an organic light-emitting diode (OLED) display screen or a micro light-emitting diode (Micro-LED) display screen. In an example of an OLED display screen, the fingerprint identification module 130 may use a display unit (that is, an OLED light source) of the OLED display screen 120 located in the fingerprint detecting region 103 as an excitation light source for optical fingerprint detection. When a finger 140 is pressed against the fingerprint detecting region 103, the display screen 120 emits a beam of light 111 to the target finger 140 above the fingerprint detecting region 103, and the light 111 is reflected by a surface of the finger 140 to form reflected light or scattered inside the finger 140 to form scattered light. In related patent applications, the foregoing reflected light and scattered light are collectively referred to as reflected light for convenience of description. Since a ridge and a valley of a fingerprint have different light reflecting capabilities, reflected light 151 from the ridge of the fingerprint and reflected light 152 from the valley of the fingerprint have different light intensities. After passing through the optical assembly 132, the reflected light is received by the sensing array 133 in the fingerprint identification module 130 and converted into a corresponding electrical signal, that is, a fingerprint detecting signal; and fingerprint image data may be obtained based on the fingerprint detecting signal, and fingerprint matching verification may be further performed, thereby implementing an optical fingerprint identification function in the terminal device 10.

In other embodiments, the fingerprint identification module 130 may also use an internal light source or an external light source to provide a light signal for fingerprint detection. In this case, the fingerprint identification module 130 may be applicable to a non-self-light-emitting display screen, such as a liquid crystal display screen or another passive light-emitting display screen. In an example of a liquid crystal display screen having a backlight module and a liquid crystal panel, in order to support under-screen fingerprint detection of the liquid crystal display screen, an optical fingerprint system of the terminal device 10 may further include an excitation light source for optical fingerprint detection. The excitation light source may specifically be an infrared light source or a light source of non-visible light at a specific wavelength, and may be disposed under the backlight module of the liquid crystal display screen or disposed in an edge region under a protective cover of the terminal device 10. The fingerprint identification module 130 may be disposed under the liquid crystal panel or an edge region of the protective cover, and by being directed over a light path, light for fingerprint detection may reach the fingerprint identification module 130. Alternatively, the fingerprint identification module 130 may also be disposed under the backlight module, and the backlight module allows the light for fingerprint detection to pass through the liquid crystal panel and the backlight module and reach the fingerprint identification module 130 by drilling an opening on film layers such as a diffusion sheet, a brightening sheet, or a reflection sheet, or by performing other optical designs. When the fingerprint identification module 130 uses an internal light source or an external light source to provide a light signal for fingerprint detection, a detection principle is consistent with the foregoing description.

It should be understood that, in a specific implementation, the terminal device 10 further includes a transparent protective cover 110; and the cover 110 may be a glass cover or a sapphire cover, and is located above the display screen 120 and covers the front face of the terminal device 10. Therefore, in the embodiment of the present application, the so-called finger being pressed against the display screen 120 actually refers to being pressed against the cover 110 above the display screen 120 or a surface of a protective layer covering the cover 110.

It should also be understood that, in the embodiment of the present application, the sensing array in the fingerprint identification module may also be referred to as a pixel array, and the optical sensing units or sensing units in the sensing array may also be referred to as pixel units.

It should be noted that the fingerprint identification module in the embodiment of the present application may also be referred to as an optical fingerprint identification module, a fingerprint identification apparatus, a fingerprint identification module, a fingerprint module, a fingerprint capturing apparatus, or the like, and the foregoing terms may be replaced with each other.

As an implementation, in a typical fingerprint identification apparatus under an OLED display screen, a fingerprint identification module is generally attached to a lower surface of a display screen. For example, the fingerprint identification module is an optical fingerprint chip, and the optical fingerprint chip is completely fixed to the lower surface of the display screen by an adhesive in a fully attaching manner. In the fingerprint identification apparatus, an attaching area between the optical fingerprint chip and the display screen is large, resulting in difficult assembly, disassembly and maintenance of the optical fingerprint chip.

In another implementation, in a fingerprint identification apparatus under an OLED display screen, a fingerprint identification module needs an optical lens assembly composed of at least two optical lenses to image a fingerprint. The fingerprint identification module is disposed under an OLED screen and a certain distance is ensured between the fingerprint identification module and the OLED screen. For example, the fingerprint identification module may be mounted to a lower surface of a middle frame of an electrode device, the middle frame may serve as a fixing support between the fingerprint identification module and the display screen, and an upper surface of the middle frame may be attached to an edge part of a lower surface of the display screen by a foam adhesive. In the fingerprint identification apparatus, due to imaging requirements of an optical lens, there is a certain gap between the fingerprint identification module and the OLED screen, resulting in a large thickness of space under the screen occupied by the fingerprint identification module.

In order to solve the foregoing problem, an embodiment of the present application provides a fingerprint identification apparatus, which is capable of reducing under-screen space occupied by a fingerprint identification module and facilitating assembly, disassembly and maintenance of the fingerprint identification module.

Figure 2:
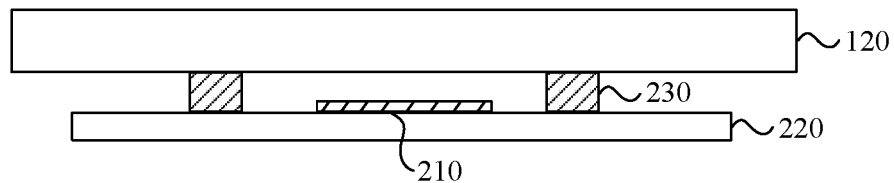
FIG. 2 is a schematic structural diagram of a fingerprint identification apparatus according to an embodiment of the present application.

FIG. 2 is a schematic structural diagram of a fingerprint identification apparatus according to an embodiment of the present application, which is applicable to an electrode device having a display screen. As shown in FIG. 2, a fingerprint identification apparatus 20 includes:

at least one optical fingerprint sensor 210; and a flexible circuit board 220 electrically connected to the at least one optical fingerprint sensor 210;

where a first adhesive layer 230 is disposed at a periphery of the flexible circuit board 220 for connecting the flexible circuit board 220 and the display screen 120, so that the at least one optical fingerprint sensor 210 is located under the display screen 120, the at least one optical fingerprint sensor 210 is configured to receive a fingerprint detecting signal returned by reflection or scattering via a human finger on the display screen, and the fingerprint detecting signal is used to detect fingerprint information of the finger.

Optionally, in some embodiments, the fingerprint identification apparatus 20 may include only one optical fingerprint sensor 210. In this case, a fingerprint detecting region of the fingerprint identification apparatus 20 has a small area and a fixed position on the display screen. For example, the optical fingerprint sensor 210 may be disposed under a middle region of the display screen 120 through the flexible circuit board 220 to be in line with use habits of a user and convenient for holding by the user.

Optionally, in other alternative embodiments, the fingerprint identification apparatus 20 may specifically include a plurality of optical fingerprint sensors 210. The plurality of optical fingerprint sensors 210 may be disposed on the flexible circuit board 220 side by side in a splicing manner and electrically connected to the flexible circuit board. A first adhesive layer 230 is disposed at a periphery of the flexible circuit board 220 for connecting the flexible circuit board 220 and the display screen 120, so that the plurality of optical fingerprint sensors 210 are disposed under the display screen 120 side by side, and sensing regions of the plurality of optical fingerprint sensors 210 collectively constitute a fingerprint detecting region of the fingerprint identification apparatus 20 on the display screen 120. That is, the fingerprint detecting region of the fingerprint identification apparatus 20 may include a plurality of sub-regions, each sub-region corresponding to a sensing region of one of the optical fingerprint sensors 210 respectively, so that a fingerprint detecting region of the fingerprint identification apparatus 20 may be extended to a main region of a lower half part of the display screen, that is, to a region generally pressed against by the finger, thereby implementing a blind pressing type of fingerprint input operation. Alternatively, when the number of the optical fingerprint sensors 210 is sufficient, the fingerprint detecting region may also be extended to a half of the display region or even the entire display region, thereby implementing half-screen or full-screen fingerprint detection.

Optionally, the at least one optical fingerprint sensor 210 is disposed under the display screen 120 without contact.

In the embodiment of the present application, after the optical fingerprint sensor 210 is fixedly mounted to the flexible circuit board 220, the optical fingerprint sensor 210 may be fixedly mounted under the display screen 120 of the electronic device through the flexible circuit board 220, which avoids directly attaching the optical fingerprint sensor 210 to the display screen 120. Installation difficulty and complexity of the optical fingerprint sensor 210 could be reduced, maintainability is improved, and under-screen space occupied by the fingerprint identification apparatus is reduced.

In addition, in a scenario of the plurality of optical fingerprint sensors 210, the plurality of optical fingerprint sensors 210 may be fixedly mounted under the display screen 120 at one time, which could reduce installation complexity and improve installation efficiency.

Figure 3:
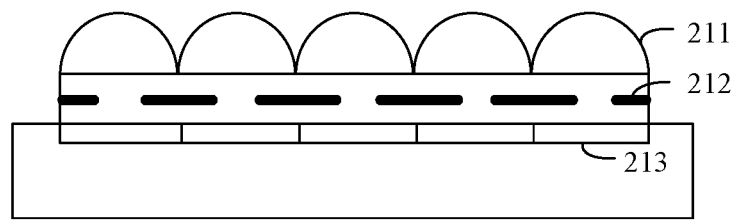
FIG. 3 is a schematic structural diagram of an optical fingerprint sensor in a fingerprint identification apparatus according to an embodiment of the present application.

Optionally, as shown in FIG. 3, the optical fingerprint sensor 210 may include: a micro lens array 211, at least one light shielding layer 212 and a light detection array 213; and the at least one light shielding layer 212 is disposed under the micro lens array, where each of the at least one light shielding layer 212 is provided with a plurality of light passing holes; and the light detection array 213 is disposed under the at least one light shielding layer 212;

where the micro lens array 213 is configured to converge the fingerprint detecting signal to a plurality of light passing holes of the at least one light shielding layer 212, and the fingerprint detecting signal is transmitted to the light detection array 213 through the plurality of light passing holes.

The light detection array 213 includes a plurality of sensing units. The sensing unit is configured to receive a light signal reflected via a finger and process the light signal to obtain one fingerprint image unit, and the fingerprint image unit is one unit pixel in a fingerprint image. Optionally, the sensing unit may adopt elements such as a photo diode, a metal oxide semiconductor field effect transistor (MOSFET). Optionally, the sensing unit has high light sensitivity and high quantum efficiency for light at a specific wavelength, so as to detect a light signal at a corresponding wavelength. It should be understood that the light detection array 213 in FIG. 3 may also be the sensing array 133 in FIG. 1, and description of its related function and structure may refer to the foregoing related description.

The at least one light shielding layer 212 may be formed above the light detection array 213 by a semiconductor growth process or other processes. For example, a layer of film of a non-light transmitting material is prepared above the light detection array 213 by methods such as atomic layer deposition, sputter coating, electron beam evaporation coating and ion beam coating; and then small-hole pattern lithography and etching are performed to form a plurality of light passing holes. The at least one light shielding layer 212 may shield optical interference between adjacent micro lenses and sensing units so that a fingerprint detecting signal corresponding to the sensing unit is converged to an interior of the light passing hole through the micro lens and transmitted to the sensing unit via the light passing hole for optical fingerprint imaging. Optionally, a transparent medium layer isolates the light detection array 213 from the light shielding layer 212, and isolates a plurality of light shielding layers 212 from each other.

The micro lens array 211 are formed by a plurality of micro lenses, and may be formed above the at least one light shielding layer 212 by a semiconductor growth process or other processes, and each micro lens may correspond to one of the sensing units in the light detection array 213, respectively.

With the optical fingerprint sensor according to the embodiment of the present application, a thickness of the optical fingerprint sensor is reduced while a fingerprint image for identification in a large area with high resolution is implemented, thereby improving performance of the optical fingerprint apparatus.

In the embodiment of the present application, the at least one optical fingerprint sensor 210 may be electrically connected to the flexible circuit board, e.g. a flexible printed circuit (FPC), and achieve electrical interconnection and signal transmission with other peripheral circuits or other elements of the electronic device through the flexible circuit board 220. For example, the at least one optical fingerprint sensor 210 may receive a control signal of a processing unit of the electronic device through the flexible circuit board 220, and may also output a fingerprint signal to the processing unit, a control unit or the like of the electronic device through the flexible circuit board 220.

Optionally, the flexible circuit board 220 may include a chip on film (chip on FPC, COF) layer and a plurality of electronic components. Optionally, the COF layer may be used as a carrier, and the electronic components are directly encapsulated on the COF layer to form a chip encapsulation product. The COF layer may also be referred to as a COF flexible encapsulation substrate, the COF flexible encapsulation substrate refers to an encapsulated flexible substrate without a chip and components, which serves as an important component of a printed circuit board (PCB).

Optionally, the flexible circuit board 220 may be provided with an image processor. The image processor may be specifically a microprocessor (micro processing unit, MCU) for receiving a fingerprint detecting signal (for example, a fingerprint image) transmitted from the optical fingerprint sensor 210 through the flexible circuit board 220 and performing fingerprint identification based on the fingerprint detecting signal.

Specifically, the optical fingerprint sensor 210 first receives reflected light reflected from the user finger and performs imaging based on the received light signal to generate a fingerprint image; then, the fingerprint image is transmitted to the image processor through the flexible circuit board 220 so that the image processor performs image processing to obtain a fingerprint signal; and finally, fingerprint identification is performed on the fingerprint signal through an algorithm.

Optionally, the flexible circuit board 220 may be provided with at least one capacitor for optimizing a fingerprint detecting signal captured by the optical fingerprint sensor 210. For example, the at least one capacitor is configured to perform filtering processing on the fingerprint detecting signal captured by the optical fingerprint sensor 210.

Optionally, the flexible circuit board 220 may be provided with at least one storage unit for storing a fingerprint signal obtained after the processing by the microprocessor. For example, the at least one storage unit is a flash memory (flash).

Figure 4:
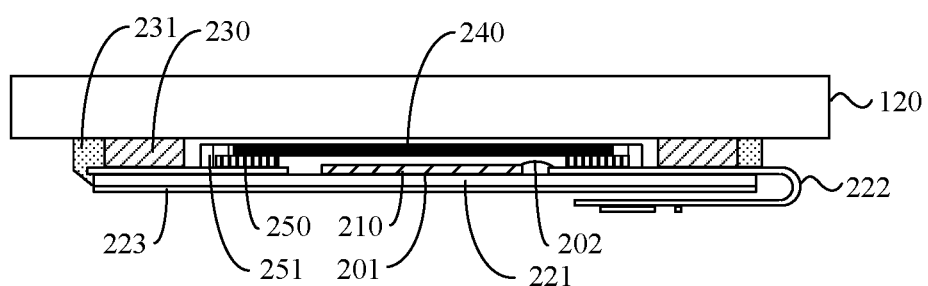
FIG. 4 is a schematic structural diagram of another fingerprint identification apparatus according to an embodiment of the present application.
Figure 5:
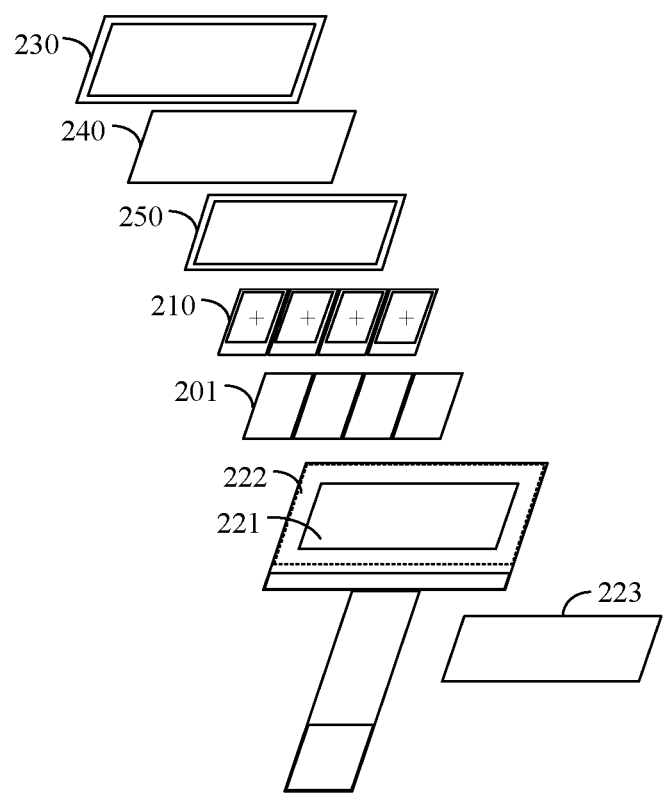
FIG. 5 is a schematic split structural diagram of the fingerprint identification apparatus shown in FIG. 4.

Optionally, as shown in FIG. 4 and FIG. 5, the flexible circuit board 220 may include a stiffening layer (e.g. stiffener) 221 and a circuit layer 222. The stiffening layer 221 is disposed under the circuit layer 222, the circuit layer 222 is provided with a window, the optical fingerprint sensor 210 is disposed in the window and connected to the stiffening layer 221 through a second adhesive layer 201, and the optical fingerprint sensor 210 is electrically connected to the circuit layer 222 through an electrical connection device 202.

Optionally, the stiffening layer 221 is a stiffening plate. It should be understood that a material of the stiffening plate may be stainless steel, aluminum foil, glass fiber or another organic material, which is not limited in the embodiment of the present application. Preferably, the stiffening layer 221 is a metal stiffening plate.

Optionally, a thickness of the stiffening layer 221 ranges from 0.15 mm to 0.30 mm to control a thickness of the fingerprint identification apparatus 20.

Optionally, surface roughness of the stiffening layer 221 is measured by a contour arithmetic mean deviation Ra, and the Ra of the stiffening layer 221 is greater than a certain threshold, such as 0.25 µm, to improve an imaging effect. Specifically, when the surface roughness of the stiffening layer 221 is greater than a certain threshold, its surface may scatter light signals, which could effectively reduce light signals that are emitted from the display screen 120 and reflected inside the fingerprint identification apparatus 20, and further avoid the influence of light reflection on imaging. In addition, when the surface roughness of the stiffening layer 221 is greater than a certain threshold, reliability of connection between the stiffening layer 210 and other components may be increased, such as reliability of connection between the stiffening layer 221 and the optical fingerprint sensor chip 210 and reliability of connection between the stiffening layer 221 and the circuit layer 222.

Optionally, planeness of the stiffening layer 221 is less than a certain threshold, such as 0.03 mm. specifically, planeness of a connection region between the optical fingerprint sensor and the stiffening layer is less than 0.03 mm to ensure reliability of connection between the optical fingerprint sensor and the stiffening layer.

Optionally, the second adhesive layer 201 is a die attach film (DAF), which could implement ultrathin connection between the optical fingerprint sensor 210 and the stiffening layer 221.

Optionally, the electrical connection device 202 is any device that implements electrical connection, or may be a wire bonding (WB) device. For example, the electrical connection device 202 may be a bonding wire with a material of Au.

It should be understood that the electrical connection device may also be a micro metal connection post or other electrical connection device such as a connector, as long as electrical connection between two electrical modules could be achieved, which is not limited in the embodiment of the present application.

Optionally, as shown in FIG. 5, the first adhesive layer 230 is in a hollow square or circular shape, and is disposed in a non-circuit region of the circuit layer 222.

Optionally, the first adhesive layer 230 is a module attaching double-sided adhesive tape (e.g. fingerprint module tape), and two sides of the module attaching double-sided adhesive tape are bonded to the display screen 120 and the flexible circuit board, respectively.

Optionally, as shown in FIG. 4, a first sealant 231 is disposed on an outer side of the first adhesive layer 230 for connecting the display screen 120, the first adhesive layer 230 and the flexible circuit board 220. Specifically, the first sealant 231 may be formed on the outer side of the first adhesive layer 230 by means of dispensing to enhance sealing between the display screen 120 and the flexible circuit board 220, thereby strengthening protection of the optical fingerprint sensor 210 between the display screen 120 and the flexible circuit board 220.

Optionally, as shown in FIG. 4 and FIG. 5, the fingerprint identification apparatus 20 further includes: a filter 240, and the filter 240 is disposed between the optical fingerprint sensor 210 and the display screen 120 for filtering out a light signal in a non-target wave band and transmitting a light signal in a target wave band.

Optionally, an area of the filter 240 is larger than an area of a fingerprint detecting region of the at least one optical fingerprint sensor 210.

Optionally, the filter 240 is located under the fingerprint detecting region, and an orthographic projection of the filter 240 on the display screen 120 covers the fingerprint detecting region.

The filter 240 may include one or more optical filters; the one or more optical filters may be configured, for example, as bandpass filters to allow transmission of light emitted from an OLED screen, while shielding infrared light and other light components in the sunlight. This optical filtering could be effective in reducing background light caused by the sunlight when the under-screen fingerprint identification apparatus 20 is used outdoors. The one or more optical filters can be implemented as, for example, optical filter coatings formed on one or more continuous interfaces or may be implemented on one or more discrete interfaces. It should be understood that the filter 240 may be fabricated on a surface of any optical component or in an optical path along reflected light formed by reflection via a finger to the optical fingerprint sensor 210.

In the embodiment of the present application, the filter 240 is used to reduce undesired ambient light in fingerprint sensing to improve optical sensing of received light by the optical fingerprint sensor 210. The filter 240 may be specifically used to filter out light at a specific wavelength, such as near infrared light and part of red light. For example, human fingers absorb most of energy of light at a wavelength below 580 nm, and if one or more optical filters or optical filtering layers are designed to reject light at a wavelength from 580 nm to infrared, undesired contributions to the optical detection in fingerprint sensing from the ambient light may be greatly reduced.

Optionally, reflectance of the filter 240 to light is less than 1%, thereby ensuring that the optical fingerprint sensor 210 could receive sufficient light signals so as to improve a fingerprint identification effect.

For example, inorganic coating is performed on a light incident face of the filter 240 by methods such as atomic layer deposition, sputter coating, electron beam evaporation coating, and ion beam coating, and a layer of film material with high transmittance and low reflectance is prepared to achieve ultra-low reflection of light. Alternatively, organic blackening coating processing is performed on a light incident face of the filter 240, that is, a layer of organic black paint is coated, and the black paint may transmit visible light and has reflectance less than 1% to the visible light. In the embodiment of the present application, the light incident face of the filter is an upper surface of the filter.

Optionally, as shown in FIG. 4 and FIG. 5, the flexible circuit board 220 is further provided with a third adhesive layer 250 for connecting the flexible circuit board 220 and the filter 240.

Optionally, as shown in FIG. 5, the third adhesive layer 250 is in a hollow square or circular shape, and is disposed in the non-circuit region on the circuit layer 222.

Optionally, an adhesive width of the third adhesive layer 250 is greater than 0.6 mm to ensure that the flexible circuit board 220 and the filter 240 are fixedly connected.

Optionally, there may be an air gap not filled with any auxiliary material between the filter 240 and the optical fingerprint sensor 210, or an adhesive with a refractive index lower than a preset refractive index may be filled between the filter 240 and the optical fingerprint sensor 210. For example, the preset refractive index includes, but is not limited to 1.3.

It should be noted that when the filter 240 is attached to an upper surface of the optical fingerprint sensor 210 by filling of an optical adhesive, once a thickness of the adhesive covering the upper surface of the optical fingerprint sensor 210 is uneven, the Newton ring phenomenon may occur, thereby affecting the fingerprint identification effect. In the embodiment of the present application, there is an air layer or an adhesive with a low refractive index between the filter 240 and the fingerprint sensor 210, which could avoid occurrence of the problem of the Newton ring to improve the fingerprint identification effect.

Optionally, in a possible implementation manner, the third adhesive layer 250 and the first adhesive layer 230 are both in a hollow square shape, the third adhesive layer 250 is disposed in a hollow region of the first adhesive layer 230, and there is a certain air gap between the first adhesive layer 230 and the third adhesive layer 250.

Optionally, a distance between the first adhesive layer 230 and the third adhesive layer 250 is greater than a certain threshold, such as 0.6 mm.

Optionally, the electrical connection device 202 is lower than a lower surface of the filter 240. That is, air or an adhesive with a low refractive index is also filled between the electrical connection device 202 and the filter 240.

Optionally, an upper surface of the first adhesive layer 230 is not higher than an upper surface of the filter 240 to reduce a thickness of space occupied by the under-screen fingerprint apparatus 20. When the upper surface of the first adhesive layer 230 is parallel to the upper surface of the filter 240, the filter 240 is in contact with a lower surface of the display screen 120.

Optionally, as shown in FIG. 4, a second sealant 251 is disposed on an outer side of the third adhesive layer 250 for connecting the filter 240, the third adhesive layer 250 and the flexible circuit board 220. Specifically, the second sealant 251 may be formed on the outer side of the third adhesive layer 250 by means of dispensing to enhance sealing between the filter 240 and the flexible circuit board 220, thereby strengthening protection of the optical fingerprint sensor 210 between the filter 240 and the flexible circuit board 220.

A specific structure of the display screen 120 in the embodiment of the present application will be described in detail hereinafter with reference to FIG. 6.

Figure 6:
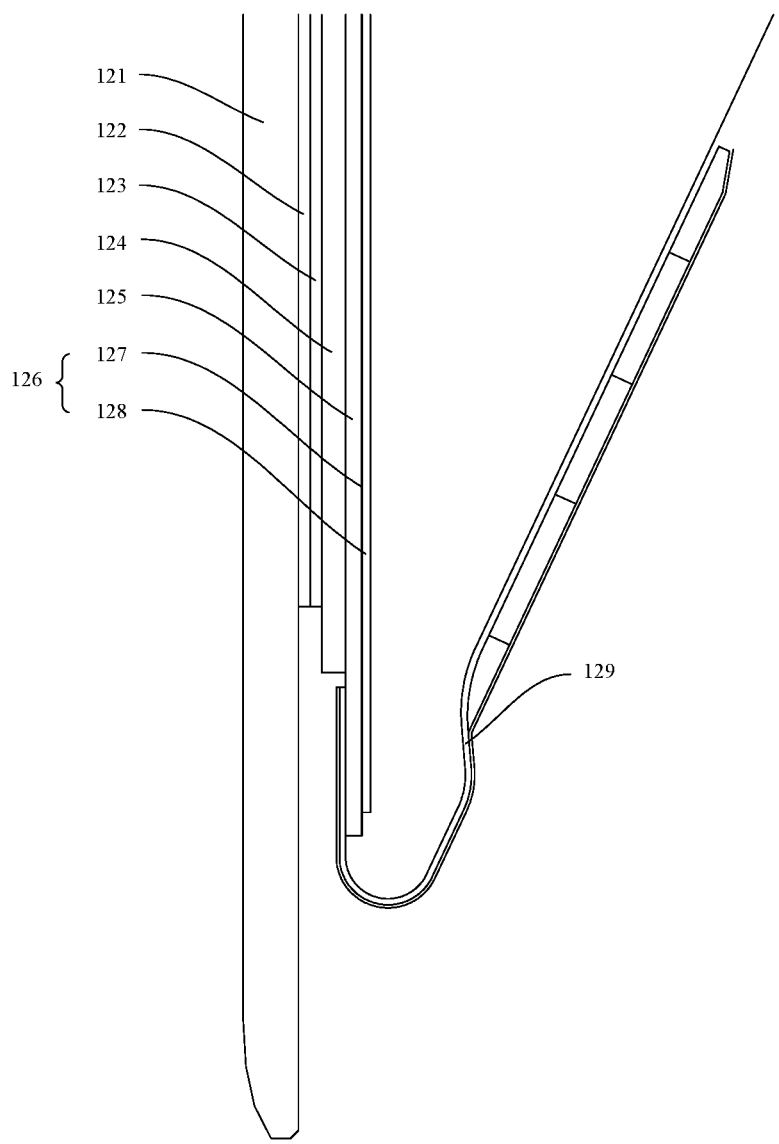
FIG. 6 is a schematic structural diagram of a display screen according to an embodiment of the present application.

As shown in FIG. 6, the display screen 120 may include a display assembly 125 and a light-blocking protective layer 126.

The light-blocking protective layer 126 includes a light blocking layer 127, which is disposed under the display assembly 125, the light blocking layer 127 is provided with an opening window, and the fingerprint identification apparatus 20 receives a light signal emitted by the display assembly 125 that is formed after being reflected via a human finger through the opening window, and the light signal is used for fingerprint identification.

The optical fingerprint sensor 210 in the fingerprint identification apparatus 20 is in contact with a lower surface of the display assembly 125, or there is a gap between the optical fingerprint sensor 210 and a lower surface of the display assembly 125. The gap may be an air gap that is not filled with any auxiliary material, which could ensure that the optical fingerprint sensor 210 will not be in contact with the lower surface of the display screen when the display screen is pressed or the electronic device falls or collides, and stability and performance of fingerprint identification for the optical fingerprint sensor 210 are not affected.

The display assembly 125 may be a light-emitting layer of the display screen 120. For example, the display assembly 125 may be an OLED organic light-emitting panel manufactured by a low temperature poly-silicon (LTPS) technology, and it is ultrathin in thickness, light in weight and low in power consumption and may be used to provide clearer images. When there is a gap between the optical fingerprint sensor 210 and the display assembly 125, the gap may be less than or equal to a preset threshold, and the preset threshold include, but is not limited to 600 μm.

The light blocking layer 127 may also be used as a screen print layer or an embossed layer, the screen print layer may be provided with patterns and texts, and the patterns and texts may be used as a logo such as a trademark pattern. The light blocking layer 127 may be a black sheet-like layer or a print layer for shielding light.

Optionally, as shown in FIG. 6, the light-blocking protective layer 126 may further include a protective layer 128 for protecting the display screen 120. Similar to the light blocking layer 127, the protective layer 128 is also provided with an opening window, the fingerprint identification apparatus 20 receives a light signal emitted by the display assembly 125 that is formed after being reflected via a human finger through the opening window, and the light signal is used for fingerprint identification. In other embodiments, the protective layer 128 may also be referred to as a cushion layer or a rear panel, or may integrally form the light-blocking protective layer 126.

The protective layer 128 may further include a heat dissipation layer. For example, the protective layer 128 may include at least a part of the heat dissipation layer formed of a metal material.

Optionally, as shown in FIG. 6, the display screen 120 may further include a wiring layer 124, which may include wiring for electrical connection of the optical fingerprint sensor 210 and/or the display screen 120.

Optionally, as shown in FIG. 6, the display screen 120 may further include a polarizer (POL) 123. The polarizer may also be referred to as a polarization light sheet for generating polarized light. The polarized light is used for light signal imaging.

Optionally, as shown in FIG. 6, the display screen 120 may further include a cover glass 121, and the cover glass 121 is configured to protect the display screen 120.

Optionally, as shown in FIG. 6, the cover glass 121 may be attached to the polarizer 123 by an optically clear adhesive (OCA) 122. The OCA 122 may be a layer of double-side adhesive without s substrate.

Alternatively, the OCA 122 may be any type of adhesives for bonding transparent optical elements (such as a lens), as long as it is colorless and transparent, and has the characteristics of greater light transmittance than a certain threshold (for example, above 90%), good bonding strength, curing at a room temperature or medium temperature, small curing shrinkage, and the like. For example, the OCA 122 may be replaced with optically clear resin (OCR).

Optionally, as shown in FIG. 6, the display screen 120 may further include a display screen flexible circuit board 129, and one end of the display screen flexible circuit board 129 is connected to the display screen. The display screen flexible circuit board 129 may include a COF layer and a drive integrated circuit (IC) chip of the display screen 120.

Figure 7:
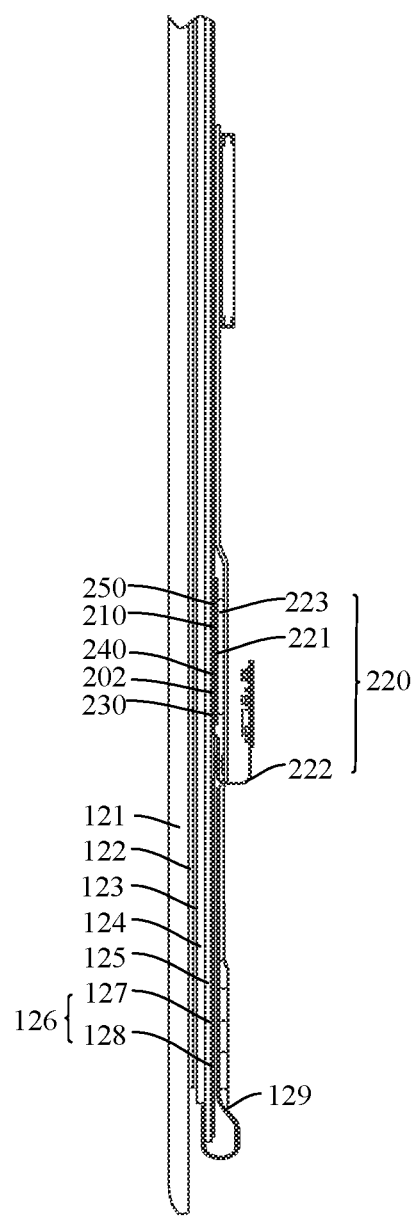
FIG. 7 is a schematic structural diagram of a display screen and a fingerprint identification apparatus of an electronic device after assembly according to an embodiment of the present application.

As a possible implementation manner, FIG. 7 shows a schematic structural diagram of a display screen and a fingerprint identification apparatus of an electronic device after assembly according to an embodiment of the present application.

In this embodiment, by controlling sizes of the first adhesive layer 230 and each part, a distance between the optical fingerprint sensor 210 and the display assembly 125 of the display screen 120 is within 600 μm so that the imaging of the screen structure is blurred, but the imaging of the structure of the fingerprint is not affected. The shorter the distance between the fingerprint sensor chip 210 and the display screen is, the better the fingerprint identification performance is. Therefore, under a premise of permission of reliability and process capability, the distance between the fingerprint sensor chip 210 and the display screen 120 may be shorten as far as possible.

Figure 8:
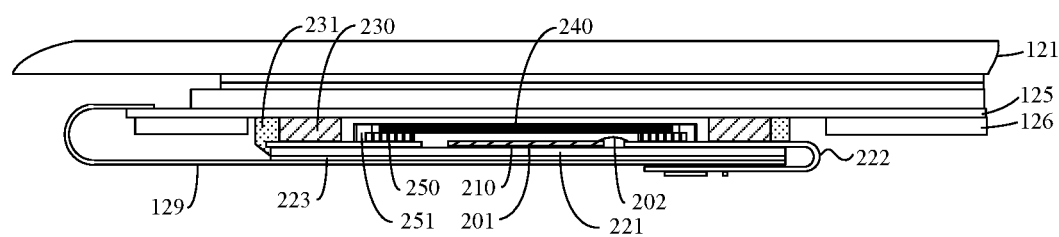
FIG. 8 is a schematic structural diagram of the fingerprint identification apparatus shown in FIG. 7.

FIG. 8 is an enlarged view of a portion of FIG. 7. As shown in FIG. 8, the first adhesive layer 230 is configured to connect the display assembly 125 of the display screen 120 and the flexible circuit board 220.

Specifically, the light-blocking protective layer 126 of the display screen 120 is provided with a first window, and at least a partial region of the fingerprint identification apparatus 20 is located in the first window, where the first adhesive layer 230 is at least partially located in the first window, and the first adhesive layer 230 connects the display assembly 125 and the flexible circuit board 220 through the first window.

Optionally, the optical fingerprint sensor 210 is disposed in the first window, a projection of the first window on the display screen completely covers the fingerprint detecting region in the display screen 120, and the first window completely covers the sensing array 213 in the optical fingerprint sensor 210.

Optionally, in the embodiment of the present application, the first sealant 231 is used to connect the display assembly 125 in the display screen 120, the first adhesive layer 230 and the flexible circuit board 220. Specifically, the first sealant 231 may be formed on the outer side of the first adhesive layer 230 by means of dispensing to enhance sealing between the display assembly 125 in the display screen 120 and the flexible circuit board 220.

In the embodiment of the present application, the upper surface of the first adhesive layer 230 and the upper surface of the filter 240 can be located in the same plane, and both are in contact with a lower surface of the display assembly 125.

Optionally, as shown in FIG. 8, the flexible circuit board 220 further includes a foam layer 223, and the foam layer 223 is disposed under the stiffening plate 221. In the embodiment of the present application, the optical fingerprint sensor 210 is disposed on an upper surface of the stiffening plate 221 in the flexible circuit board 220. After the display screen flexible circuit board 129 is bent, the foam layer 223 is configured to connect the stiffening plate 221 and the display screen flexible circuit board 129, and the foam layer 223 is bonded to a partial region of the display screen flexible circuit board 129.

Figure 9:
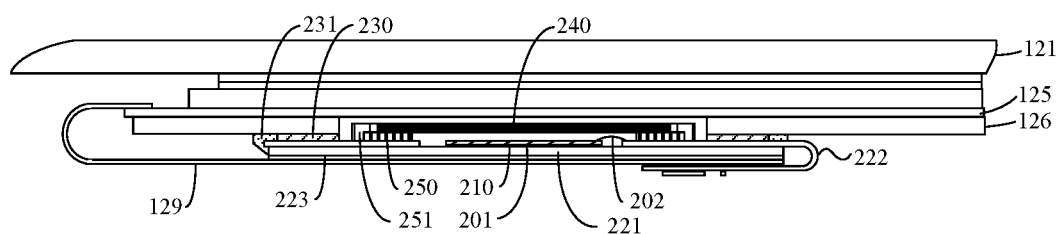
FIG. 9 is a schematic structural diagram of another fingerprint identification apparatus according to an embodiment of the present application.

Optionally, in another possible implementation manner, as shown in FIG. 9, the first adhesive layer 230 is configured to connect the light-blocking protective layer 126 of the display screen 120 and the flexible circuit board 220.

Specifically, the light-blocking protective layer 126 of the display screen 120 is provided with a second window, and at least a partial region of the fingerprint identification apparatus 20 is located in the second window, where the first adhesive layer 230 is located outside the second window. Optionally, the first adhesive layer 230 is located at a peripheral edge of the second window.

Optionally, the optical fingerprint sensor 210 is disposed under the second window, a projection of the second window on the display screen completely covers the fingerprint detecting region in the display screen 120, and the second window completely covers the sensing array 213 in the optical fingerprint sensor 210.

Optionally, in the embodiment of the present application, the first sealant 231 is used to connect the light-blocking protective layer 126 in the display screen 120, the first adhesive layer 230 and the flexible circuit board 220. Specifically, the first sealant 231 may be formed on the outer side of the first adhesive layer 230 by means of dispensing to enhance sealing between the light-blocking protective layer 126 in the display screen 120 and the flexible circuit board 220.

Optionally, an upper surface of the first adhesive layer 230 is lower than an upper surface of the filter 240.

Optionally, the filter 240 is located in the second window.

Optionally, the upper surface of the filter 240 may be in contact with the lower surface of the display assembly 125, and the upper surface of the filter 240 may also keep a certain air gap from the lower surface of the display assembly 125.

In the embodiment of the present application, after the display screen flexible circuit board 129 is bent, the foam layer 223 is configured to connect the stiffening plate 221 and the display screen flexible circuit board 129, and the foam layer 223 is bonded to a partial region of the display screen flexible circuit board 129.

Figure 10:
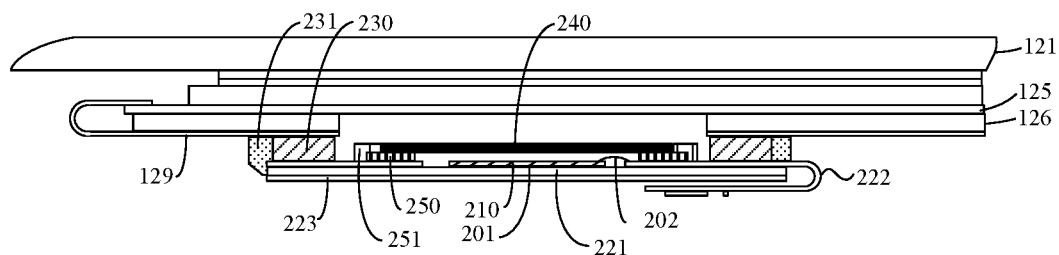
FIG. 10 is a schematic structural diagram of another fingerprint identification apparatus according to an embodiment of the present application.

Optionally, in another possible implementation manner, as shown in FIG. 10, the first adhesive layer 230 is configured to connect the display screen flexible circuit board 129 of the display screen 120 and the flexible circuit board 220 of the fingerprint identification apparatus 20.

Specifically, after being bent, the display screen flexible circuit board 129 is fixedly connected to the light-blocking protective layer 126 of the display screen.

Specifically, the light-blocking protective layer 126 of the display screen 120 is provided with a third window, and the display screen flexible circuit board 129 is provided with a circuit board window. At least a partial region of the fingerprint identification apparatus 20 is located in the third window and the circuit board window, where the first adhesive layer 230 is located outside the circuit board window. Optionally, the first adhesive layer 230 is located at a peripheral edge of the circuit board window.

Optionally, the circuit board window is disposed under the third window.

Optionally, the circuit board window and the third window have the same shape and size, the circuit board window is disposed directly under the third window, and a center of the circuit board window and a center of the third window are both located at the same perpendicular line perpendicular to the optical fingerprint sensor 210.

Optionally, the optical fingerprint sensor 210 is disposed under the circuit board window, projections of the circuit board window and the third window on the display screen completely cover the fingerprint detecting region in the display screen 120, and the circuit board window and the third window completely cover the sensing array 213 in the optical fingerprint sensor 210.

Optionally, in the embodiment of the present application, the first sealant 231 is used to connect the display screen flexible circuit board 129 in the display screen 120, the first adhesive layer 230 and the flexible circuit board 220. Specifically, the first sealant 231 may be formed on the outer side of the first adhesive layer 230 by means of dispensing to enhance sealing between the display screen flexible circuit board 129 in the display screen 120 and the flexible circuit board 220.

Figure 11:
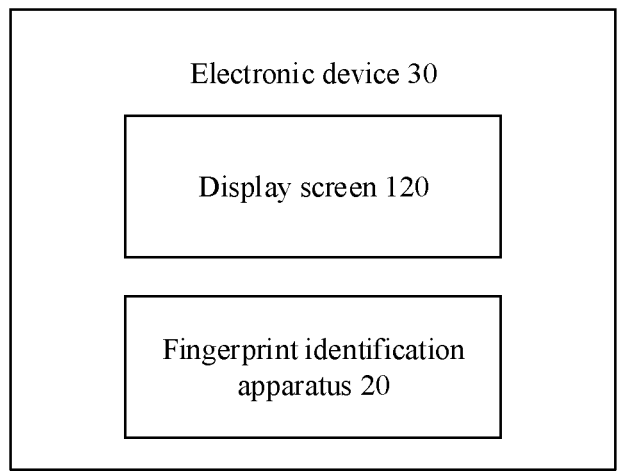
FIG. 11 is a schematic block diagram of an electronic device according to an embodiment of the present application.

As shown in FIG. 11, an embodiment of the present application further provides an electronic device 30, and the electronic device 30 may include the foregoing display screen 120 and the foregoing fingerprint identification apparatus 20 according to the embodiments of the present application, where the fingerprint identification apparatus 20 is disposed under the display screen 120.

The electronic device may be any electronic device having a display screen.

It should be understood that specific examples in the embodiments of the present application are just for helping those skilled in the art better understand the embodiments of the present application, rather than for limiting the scope of the embodiments of the present application.

It should be understood that terms used in the embodiments of the present application and the claims appended hereto are merely for the purpose of describing particular embodiments, and are not intended to limit the embodiments of the present application. For example, the use of a singular form of "a", "the above" and "said" in the embodiments of the present application and the claims appended hereto are also intended to include a plural form, unless otherwise clearly indicated herein by context.

Those of ordinary skill in the art may be aware that, units of the examples described in the embodiments disclosed in this paper may be implemented by electronic hardware, computer software, or a combination of the two. To clearly illustrate interchangeability between the hardware and the software, the foregoing illustration has generally described composition and steps of the examples according to functions. Whether these functions are performed by hardware or software depends on particular applications and designed constraint conditions of the technical solutions. Persons skilled in the art may use different methods to implement the described functions for each particular application, but it should not be considered that the implementation goes beyond the scope of the present application.

In the several embodiments provided in the present application, it should be understood that, the disclosed system and apparatus may be implemented in other manners. For example, the foregoing described apparatus embodiments are merely exemplary. For example, division of the units is merely logical function division and there may be other division manners in practical implementation. For example, multiple units or components may be combined or integrated into another system, or some features may be ignored or not executed. In addition, the displayed or discussed mutual coupling or direct coupling or communication connection may be indirect coupling or communication connection through some interfaces, apparatuses or units, and may also be electrical, mechanical, or connection in other forms.

The units described as separate components may or may not be physically separate, and components displayed as units may or may not be physical units, may be located at one position, or may be distributed on multiple network units. Some of or all of the units here may be selected according to a practical need to achieve the objectives of the solutions of the embodiments of the present application.

In addition, various functional units in the embodiments of the present application may be integrated into a processing unit, or each unit may exist alone physically, or two or more than two units may be integrated into one unit. The integrated unit may be implemented in a form of hardware, or may be implemented in a form of a software functional unit.

If the integrated unit is implemented in the form of the software functional unit and is sold or used as an independent product, it may be stored in a computer readable storage medium. Based on such understanding, the nature of the technical solutions of the present application, or the part contributing to the prior art, or all of or part of the technical solutions may be implemented in a form of software product. The computer software product is stored in a storage medium and includes several instructions for instructing a computer device (which may be a personal computer, a server, a network device, or the like) to execute all of or part of the steps of the method described in the embodiments of the present application. The foregoing storage medium includes a variety of media capable of storing program codes, such as a USB disk, a mobile hard disk, a read-only memory (ROM), a random access memory (RAM), a magnetic disk, or an optical disk.

The foregoing descriptions are merely specific implementation manners of the present application. The protection scope of the present application, however, is not limited thereto. Any person skilled in the art who is familiar with the art could readily think of various equivalent modifications or replacements within the technical scope disclosed in the present application, and such modifications or replacements shall fall within the protection scope of the present application. Therefore, the protection scope of the present application shall be subject to the protection scope of the claims.

What is claimed is:

1. A fingerprint identification apparatus applicable to an electronic device having a display screen, comprising:
    at least one optical fingerprint sensor; and
    a flexible circuit board electrically connected to the at least one optical fingerprint sensor;
    wherein a first adhesive layer is disposed at a periphery of the flexible circuit board for connecting the flexible circuit board and the display screen, so that the at least one optical fingerprint sensor is located under the display screen, the at least one optical fingerprint sensor is configured to receive a fingerprint detecting signal returned by reflection or scattering via a human finger on the display screen, and the fingerprint detecting signal is used to detect fingerprint information of the finger;
    wherein an optical fingerprint senor of the at least one optical fingerprint sensor comprises: a micro lens array, at least one light shielding layer and a light detection array;
    the at least one light shielding layer is disposed under the micro lens array, wherein each of the at least one light shielding layer is provided with a plurality of light passing holes; and the light detection array is disposed under the at least one light shielding layer;
    wherein the micro lens array is configured to converge the fingerprint detecting signal to a plurality of light passing holes of the at least one light shielding layer, and the fingerprint detecting signal is transmitted to the light detection array through the plurality of light passing holes; and wherein the flexible circuit board comprises a stiffening layer and a circuit layer, and the stiffening layer is disposed under the circuit layer;

wherein the circuit layer is provided with a window, and the at least one optical fingerprint sensor is disposed on the stiffening layer and located in the window.

2. The fingerprint identification apparatus according to claim 1, wherein the first adhesive layer is configured to connect a display assembly of the display screen and the flexible circuit board.

3. The fingerprint identification apparatus according to claim 1, wherein the first adhesive layer is configured to connect a light-blocking protective layer of the display screen and the flexible circuit board.

4. The fingerprint identification apparatus according to claim 1, wherein the first adhesive layer is configured to connect a display screen flexible circuit board of the display screen and the flexible circuit board.

5. The fingerprint identification apparatus according to claim 1, wherein a distance between an upper surface of the at least one optical fingerprint sensor and a lower surface of a light-emitting layer of the display screen is less than or equal to 600 μm.

6. The fingerprint identification apparatus according to claim 1, wherein the at least one optical fingerprint sensor is connected to the stiffening layer through a second adhesive layer.

7. The fingerprint identification apparatus according to claim 1, wherein the first adhesive layer is in a hollow square or circular shape, and is disposed in a non-circuit region of the flexible circuit board.

8. The fingerprint identification apparatus according to claim 1, wherein a first sealant is disposed on an outer side of the first adhesive layer for connecting the display screen, the first adhesive layer and the flexible circuit board.

9. The fingerprint identification apparatus according to claim 1, wherein the fingerprint identification apparatus further comprises:
a filter disposed between the at least one optical fingerprint sensor and the display screen for filtering out a light signal in a non-target wave band and transmitting a light signal in a target wave band.

10. The fingerprint identification apparatus according to claim 9, wherein reflectance of the filter to light is less than 1%.

11. The fingerprint identification apparatus according to claim 9, wherein there is an air gap or an adhesive with a low refractive index between the filter and the at least one optical fingerprint sensor, and the adhesive with the low refractive index has a refractive index less than 1.3.

12. The fingerprint identification apparatus according to claim 9, wherein the at least one optical fingerprint sensor is electrically connected to the flexible circuit board through an electrical connection device; and
the electrical connection device is lower than a lower surface of the filter.

13. The fingerprint identification apparatus according to claim 9, wherein an upper surface of the first adhesive layer is not higher than an upper surface of the filter.

14. The fingerprint identification apparatus according to claim 9, wherein a third adhesive layer is disposed at the periphery of the flexible circuit board for connecting the flexible circuit board and the filter.

15. The fingerprint identification apparatus according to claim 14, wherein the third adhesive layer is in a hollow square or circular shape, and is disposed in a non-circuit region of the flexible circuit board.

16. The fingerprint identification apparatus according to claim 14, wherein a distance between the third adhesive layer and the first adhesive layer is greater than 0.6 mm.

17. The fingerprint identification apparatus according to claim 14, wherein an adhesive width of the third adhesive layer is greater than 0.6 mm.

18. The fingerprint identification apparatus according to claim 14, wherein a second sealant is disposed on an outer side of the third adhesive layer for connecting the filter, the third adhesive layer and the flexible circuit board.

19. The fingerprint identification apparatus according to claim 1, wherein the stiffening layer is a metal stiffening plate, and/or a thickness of the stiffening layer ranges from 0.15 mm to 0.30 mm, and/or a contour arithmetic mean deviation Ra of surface roughness of the stiffening layer is greater than 0.25 μm, and/or planeness of the stiffening layer is less than 0.03 mm.

20. An electronic device, wherein the electronic device comprises: a display screen; and
a fingerprint identification apparatus applicable to an electronic device having a display screen, comprising:
at least one optical fingerprint sensor; and
a flexible circuit board electrically connected to the at least one optical fingerprint sensor;
wherein a first adhesive layer is disposed at a periphery of the flexible circuit board for connecting the flexible circuit board and the display screen, so that the at least one optical fingerprint sensor is located under the display screen, the at least one optical fingerprint sensor is configured to receive a fingerprint detecting signal returned by reflection or scattering via a human finger on the display screen, and the fingerprint detecting signal is used to detect fingerprint information of the finger;
wherein an optical fingerprint senor of the at least one optical fingerprint sensor comprises: a micro lens array, at least one light shielding layer and a light detection array;
the at least one light shielding layer is disposed under the micro lens array, wherein each of the at least one light shielding layer is provided with a plurality of light passing holes; and the light detection array is disposed under the at least one light shielding layer;
wherein the micro lens array is configured to converge the fingerprint detecting signal to a plurality of light passing holes of the at least one light shielding layer, and the fingerprint detecting signal is transmitted to the light detection array through the plurality of light passing holes; and
wherein the flexible circuit board comprises a stiffening layer and a circuit layer, and the stiffening layer is disposed under the circuit layer;
wherein the circuit layer is provided with a window, and the at least one optical fingerprint sensor is disposed on the stiffening layer and located in the window;
wherein the fingerprint identification apparatus is disposed under the display screen to implement under-screen fingerprint detection.

* * * * *